United States Patent [19]

Kuraishi

[11] Patent Number: 4,888,587
[45] Date of Patent: Dec. 19, 1989

[54] OVERSAMPLING A/D CONVERTER WITH TWO CAPICITOR ARRAYS

[75] Inventor: Yoshiaki Kuraishi, Tokyo, Japan

[73] Assignee: NEC Corporation, Tokyo, Japan

[21] Appl. No.: 212,988

[22] Filed: Jun. 29, 1988

[30] Foreign Application Priority Data

Jun. 29, 1987 [JP] Japan .................................. 62-162639

[51] Int. Cl.[4] ............................................. H03M 1/52
[52] U.S. Cl. ..................................... 341/122; 341/166
[58] Field of Search ............... 341/122, 123, 124, 131, 341/155, 166, 167, 169, 200

[56] References Cited

U.S. PATENT DOCUMENTS 4,308,524 12/1981 Harrison et al. ..................... 341/122
4,621,254 11/1986 Belcher ................................ 341/122

OTHER PUBLICATIONS

Yujawa et al, "An Oversampling A-To-D Converter Structure for VLSI Digital CODEC's", ICASSP-IEEE International Conference on Acoustics, Speech, and Signal Processing, Mar. 26–29, 1985, pp. 1400–1403.

*Primary Examiner*—William M. Shoop, Jr.
*Assistant Examiner*—Brian K. Young
*Attorney, Agent, or Firm*—Sughrue, Mion, Zinn, Macpeak & Seas

[57] ABSTRACT

An oversampling A/D converter having a pair of sample and hold circuits that alternately sample an input signal at high frequency and a pair of arithmetic circuits that determine the difference between a respective sampled and hold signal and a local analog signal. The difference signals are alternatively integrated and quantized into an output signal. The local analog signals are generated from the quantized output signal and supplied to the arithmetic circuit.

8 Claims, 4 Drawing Sheets

OVERSAMPLING A/D CONVERTER WITH TWO CAPICITOR ARRAYS

BACKGROUND OF THE INVENTION

This invention relates to an oversampling analog-to-digital (A/D or A-to-D) converter for sampling an input analog signal at an oversampling frequency and producing an output digital signal.

An oversampling A/D converter is ordinarily manufactured by using a very large scale integration technology. Such converters have significant promise in digital communication applications. In an oversampling A/D converter, an input analog signal of an input signal frequency bandwidth is sampled and each sample is converted into an output digital signal at an oversampling frequency. The oversampling frequency is much higher than the input signal frequency bandwidth, for example, higher than one hundred times the input signal frequency bandwidth.

An example of the oversampling A/D converter is discussed in a paper contributed jointly by Akira Yukawa, Rikio Maruta, and Kenji Nakayama to Proceedings of IEEE International Conference on Acoustics, Speech, and Signal Processing held in March 1985, pp. 1400 to 1403, under the title of "An Oversampling A-to-D Converter Structure for VLSI Digital CODEC's".

The oversampling A/D converter according to Yukawa et al, employs a large integrating capacitor. Accordingly, the time constant attributable to the output resistance of its operational amplifier and this integrating capacitor is correspondingly large. As a result, a long static time of the integrating capacitor is required every time the polarity of the input analog signal is inverted. High speed operation is thereby prevented.

This problem may be solved with a balanced A/D converter in which two electric charge redistributing D/A converters are connected in parallel as described by Yukawa in European Patent Application (EP application) publication number A2 0169535. Specifically, the static time of the integrating capacitor is shortened by inverting the connections between the D/A converters and input terminals when the polarity of the input analog signal changes. An oversampling A/D converter according to the EP application, however, uses a balanced operational amplifier as integrator, so that the circuit dimensions are increased and a greater consumption of power is inevitable. Moreover, the increase in operating speed is limited to that than corresponding to the reduction of the static time.

SUMMARY OF THE INVENTION

An object of this invention, therefore, is to provide an oversampling A/D converter capable of high speed operation with a minimum quantity of circuitry.

The oversampling A/D converter of the invention comprises two each of sample and hold circuits, subtracters and D/A converters. The two sample and hold circuits alternately sample and hold the input analog signal in a predetermined first period and generate first and second sampled signals. The two D/A converters convert first and second digital local signals into corresponding first and second analog local signals, respectively. The two substracters determine the respective differences between the first and second sampled signals on the one hand and the first and second analog local signals on the other, and generate first and second difference signals. A selector circuit alternatively selects the first and second difference signals in a second period having a duration equal to half of the duration of the first predetermined period. An integrator integrates the output signal of the selector and generates an integrated signal. A quantizer quantizes the integrated signal and generates a quantized signal. A control logic circuit generates digital signals based on the quantized signal.

A signal distributing circuit distributes the digital signal alternately to the D/A converters in the second period as the first and second digital local signals.

The present invention makes it possible to achieve about twice as fast of an operation speed compared to the speed of the conventional oversampling A/D converters by providing and alternately operating two each of sample and hold circuits, subtracters and D/A converters.

BRIEF DESCRIPTION OF THE DRAWINGS

The above and other objects, features and advantages of the present invention will become apparent from the following detailed description when taken with accompanying drawings in which.

DETAILED DESCRIPTION OF THE PREFERRED EMBODIMENT

Figure 1:
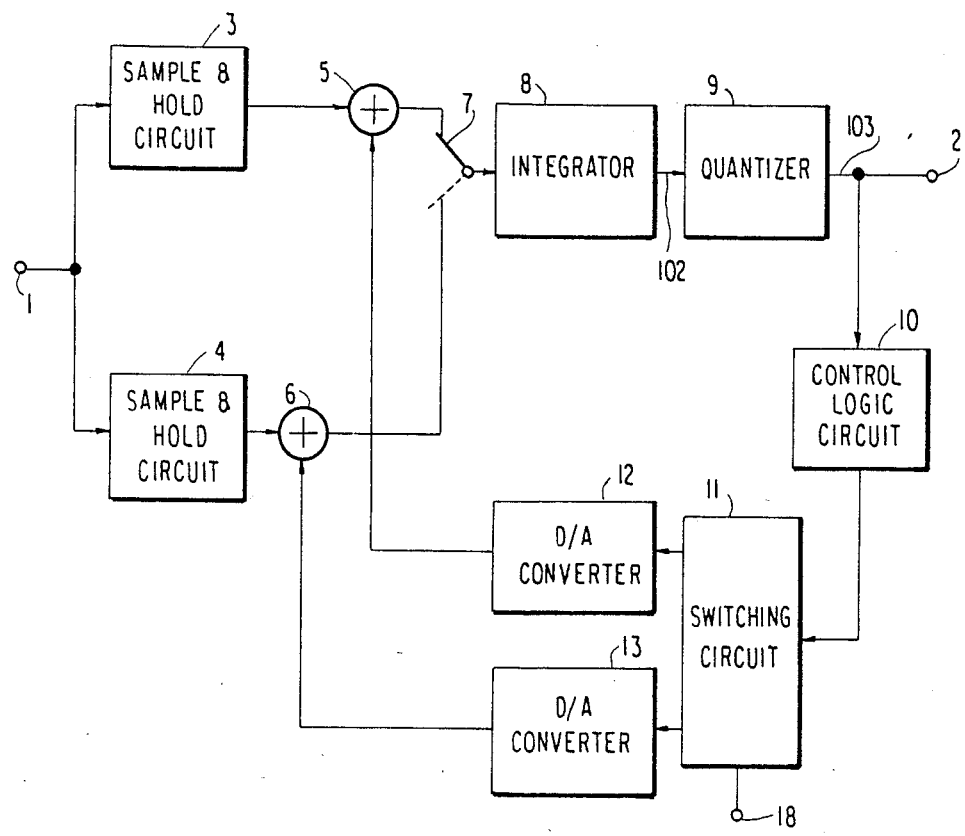
FIG. 1 is a block diagram for explaining the principle of the invention.

Referring to FIG. 1, an input analog signal entered into an input terminal 1 is alternately sampled and held by first and second sample and hold circuits (S&H circuits) 3 and 4. The sampled signals are entered into an input terminal of respective first and second adders 5 and 6, each of whose other input terminal is supplied with a local signal from first and second D/A converters 12 and 13, respectively. As described later, since the polarity of the sampled signal is different from that of the local signal, the adders 5 and 6 produce signals between the sampled signals representing the difference and local signals. The difference signals from the first and second adders 5 and 6 are selectively switched by a switch 7, operating in synchronism with the first and second S&H circuits 3 and 4, and entered into an integrator 8. The integrator 8 integrates each difference signal supplied through the switch 7, and feeds the integrated signal to a quantizer 9. The quantizer 9 quantizes the integrated signal, and supplies the quantized signal to a control logic circuit 10. The control logic circuit 10, responding to the quantized signal, supplies a control signal for first and second D/A converters 12 and 13 to a switching circuit 11. The switching circuit 11 supplies this control signal alternately to the first and second D/A converters 12 and 13 in synchronism with the operation of the switch 7. The first and second D/A converters 12 and 13 generate the analog local signals on the basis of the control signal, and supply them to the input terminals of the first and second adders 5 and 6, respectively. The output of the A/D converter is taken at an output terminal 2, connected to the output of quantizer 9.

Next will be explained the operation of the oversampling A/D converter illustrated in FIG. 1 with reference to timing charts shown as FIGS. 2A to 2G.

Figure 2:
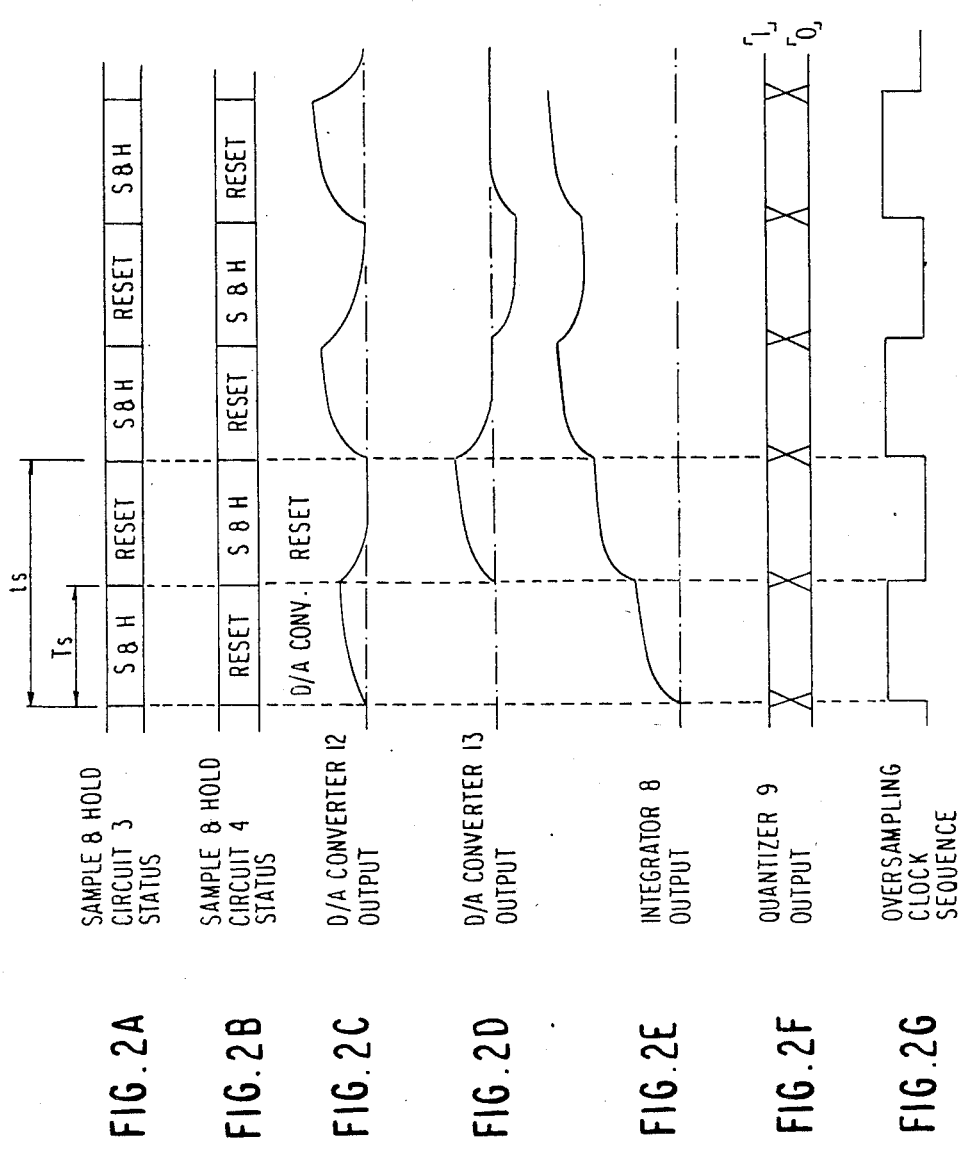
FIGS. 2A to 2G are timing charts for explaining the principle of FIG. 1.

As illustrated in FIGS. 2A and 2B, the S&H circuits 3 and 4 repeat sampling-holding and reseting in regular periods $t_s$. These two operations are so controlled by an oversampling clock sequence (FIG. 2G) that one of the S&H circuits 3 and 4 always is in the sample-hold mode and the other is in the reset mode. The control can be readily predetermined. For instance, the sample-hold mode can prevails in one circuit when the oversampling clock sequence is at its high level and the reset mode can prevail when the clock sequence is at the low level. The other S&H circuit can be controlled by a reversed oversampling clock sequence. The differences between sampled signals, which are the outputs of the S&H circuits 3 and 4, on the one hand and local signals (FIGS. 2C and 2D) from the D/A converters 12 and 13 on the other hand are determined by the adders 5 and 6, respectively. The switch 7 supplies the output signals from the adders 5 and 6 alternately to the integrator 8 as a difference signal in accordance with the oversampling clock sequence. The integrator 8 integrates the difference signals inputted through the switch 7 (FIG. 2E). A resultant integrated signal 102 is quantized by the quantizer 9 to produce a quantized signal (FIG. 2F) in periods of $T_s$, where ts=$2T_s$. A quantized output 103, besides being supplied from the output terminal 2, is entered into the control logic circuit 10. The control logic circuit 10, based on the quantized output 103, generates a control signal for the D/A converters. The control signal is alternately supplied to the two D/A converters 12 and 13 by the switching circuit 11 in synchronism with the oversampling clock sequence. It should be noted that since the period $T_s$ (the output period of the quantizer 9) of the A/D converter is set to be half of the period $t_s$ (the interval between one sampling and the next) of each individual S&H circuit, the present device achieves twice the speed of operation as a conventional oversampling A/D converter.

Figure 3:
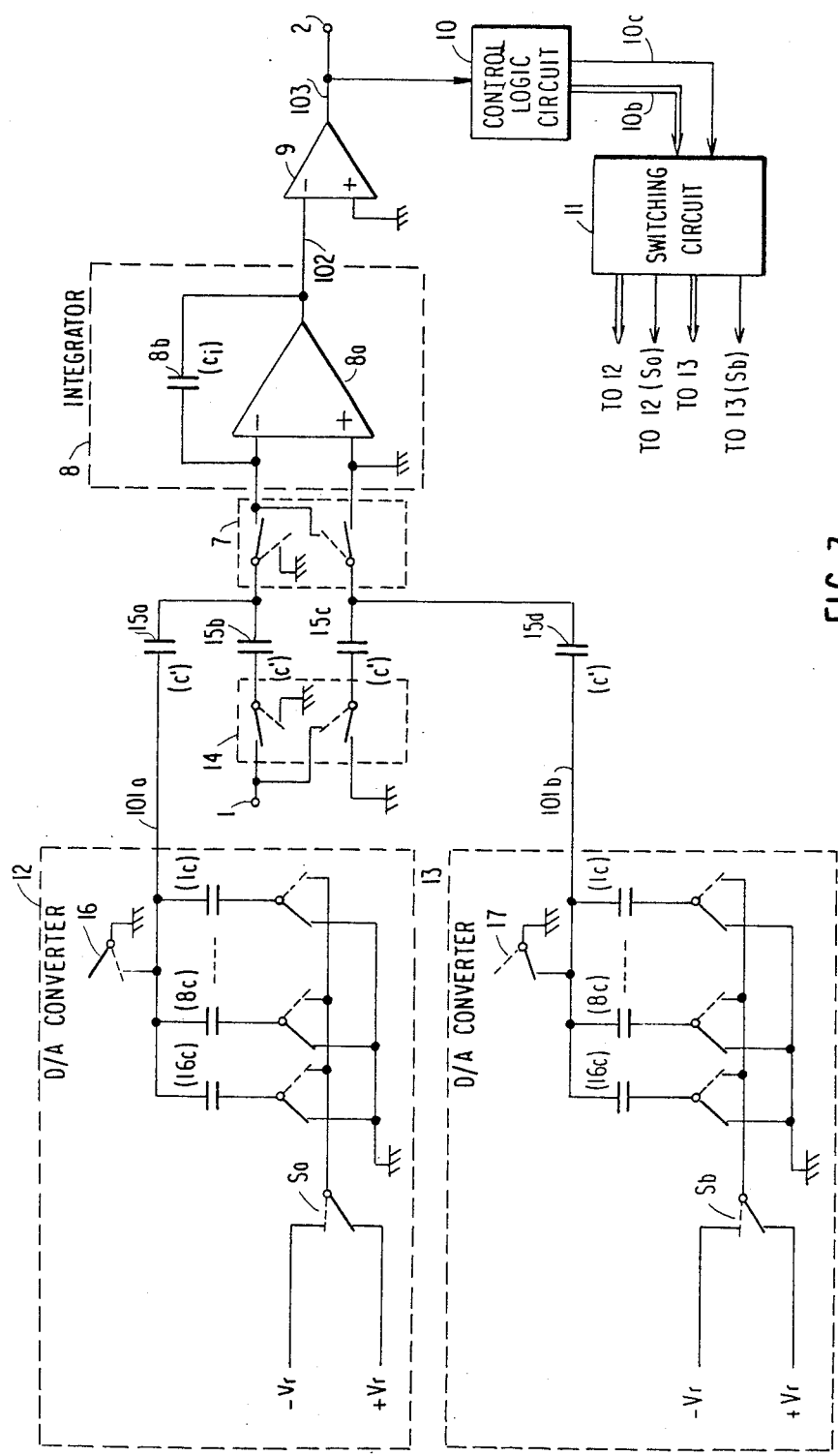
FIG. 3 is a circuit diagram illustrating a preferred embodiment of the invention.

FIG. 3 is a circuit diagram of a preferred embodiment of the present invention, a modified version of the circuit of FIG. 1 suitable for integrated circuit implementation. In FIG. 3, the first and second S&H circuits 3 and 4 and the first and second adders 5 and 6 as shown in FIG. 1 are integrated into a single unit and are represented by capacitors 15a to 15d and a switch 14. The equivalent of the integrator 8 in FIG. 1 comprises an operational amplifier 8a and an integrating capacitor 8b, and those of the first and second D/A converters 12 and 13 consist of a capacitor array described in Yukawa's EP application referred to above. Explanation of the operations of the integrator 8, first and second D/A converters 12 and 13, and quantizer 9 is dispensed with here as they are described in said EP application. The control logic circuit 10 and switching circuit 11 will be briefly described below, though a detailed explanation will further be made afterwards with reference to FIG. 4. The logic circuit 10 generates, based on the quantized signal, a control signal $10a$ for turning over switches Sa and Sb and a local signal $10b$ in a digital form for the D/A converters. The switching circuit 11, in response to the oversampling clock sequence supplied from outside as illustrated in FIG. 2G, feeds the control signal $10a$ and the local signal $10b$ alternately to the D/A converters 12 and 13. The signal $10b$ controls the switching operations of the switches (except for switches Sa and Sb) in the D/A converters 12 and 13.

Switches 14, 7, 16 and 17 achieve switching between the solid line state and the broken line state according to the oversampling clock sequence. The switches Sa and Sb, which select a reference voltage (+Vr or −Vr) given to the first and second D/A converters 12 and 13, are switched by the control signal $10a$ from the switching circuit 11. The reference voltage is +Vr when the polarity of the input analog signal is positive, or −Vr when it is negative.

As the oversampling A/D converter structured in this manner performs the same operation as the basic block illustrated in FIG. 1, description of its operation is dispensed with here.

Figure 4:
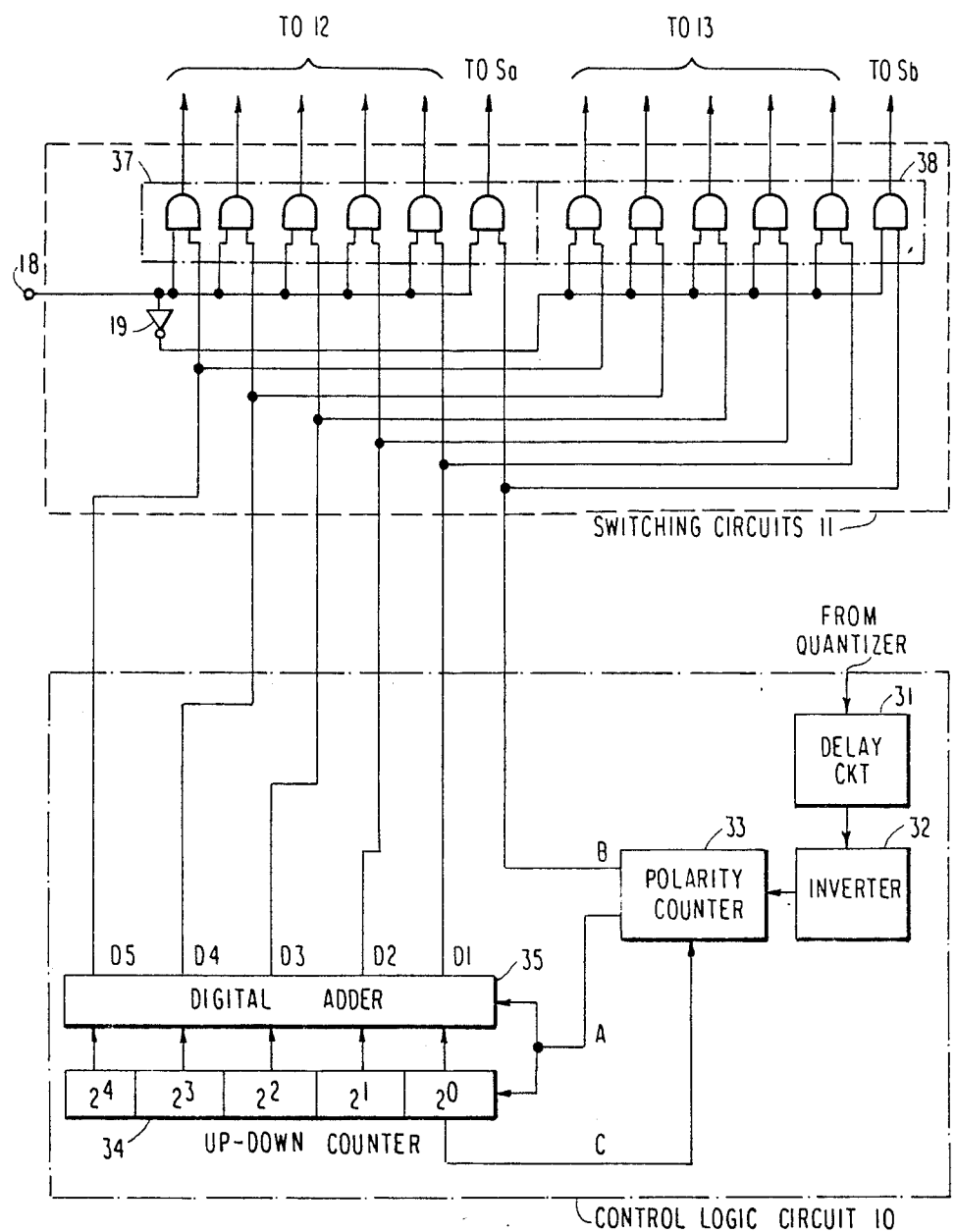
FIG. 4 is a circuit diagram illustrating in detail a control logic circuit and a switching circuit illustrated in FIG. 3.

Referring now to FIG. 4, the control logic circuit 10 and the switching circuit 11 will be described a little more in detail. It will be presumed that the number of capacitors used in the D/A converters 12 and 13 is equal to five.

A delay circuit 31 gives a delay of one oversampling period $T_s$ to the quantized signal which is supplied from the quantizer 9. The delay circuit 31 thereby produces a delayed digital signal, which is inverted by an inverter 32 into an inverted digital signal. When the input analog signal is higher than the local signal from the D/A converter, the integrated voltage of the integrator 8 becomes negative according to the following equation.

$$V_o = Qm/Ci = \left( \frac{Vr \cdot L \cdot C}{31C + C} - Vi \right) \frac{C}{Ci}$$

where Vo is the integrated voltage of the integrator 8; Qm, electric charges moved into the integrator 8; Vr, the reference voltage of the D/A converters 12 and 13; L, the local value (decimal number); Vi, the input analog signal voltage; Ci, the capacitance of an integrating capacitor 8b; and C, the minimum capacitance of the capacitors in the capacitor array of the D/A converters.

In this event, the inverted signal has a positive level. When the input analog signal is lower than the local signal, the inverted signal has a negative level.

In the manner known in the art, a polarity counter 31 is supplied with the inverted signal to produce a count signal A and a polarity signal B. An up-down counter 34 counts up and down the count signal A. Inasmuch as the number of capacitors is equal to five, the up-down counter 34 has first through fifth stages $2^0$ to $2^4$ to supply a digital adder 35 with first through fifth binary signals collectively representative of the up-down count. When the up-down count reaches 00000 and should be further counted down, the up-down counter 34 delivers a switching signal C (designated by the reference letter for the reference capacitance merely for convenience) to the polarity counter 33.

It will be assumed that the converter input terminal 1 (FIGS. 1 and 3) is supplied with the input analog signal which is positive and increasing. Meanwhile, the polarity signal B has the binary zero value. When the inverted signal has the positive level, the count signal A has the binary one value to count up the up-down count in the up-down counter 34. When the inverted signal has the negative level, the count signal A has the binary zero value to count down the up-down count.

It will then be assumed that the input analog signal is negative and has an increasing amplitude. In this event, the polarity signal B has the binary one value. When the inverted signal has the positive level, the count signal A has the binary zero value to count down the up-down count. When the inverted signal has the negative level, the count signal A has the binary one value to count up the up-down count.

As a result, the first through fifth binary signals are produced by the up-down counter 34 so that the up-down count follows a change in the input analog signal. Adding as a summand the binary one or zero value of the count signal A supplied from the polarity counter, the digital adder 35 produces first through fifth digital signals D1 to D5, which represent the local signal.

A clock input terminal 18 is supplied with the clock sequence. It should be noted that the oversampling clock sequence is delivered through connections (not depicted merely for simplicity of illustration) to the input switch 14 (FIG. 3) and to other switches, which will be described. In the illustrated example of FIG. 4, the switching circuit 11 has a pair of gate circuits 37 and 38. Each gate circuit consists of first through sixth AND gates supplied with the first through fifth digital signals D1 to D5, and the polarity signal B from the polarity counter 33, respectively. The oversampling clock sequence is fed to the AND gates of the gate circuit 37. The oversampling clock sequence is also inverted by an inverter 19 and sent to the AND gates of the gate circuit 38. As a result, the digital signals D1 to D5 of the up-down counter 34 are alternately supplied to the two D/A converters 12 and 13 according to the oversampling clock sequence. The switches 14, 7, 16 and 17 are similarly turned over according to the oversampling clock sequence.

As hitherto described, according to the present invention, the periods of time allowed for the operations of the D/A converters, adders and integrator are approximately doubled, compared with a conventional circuit for the same purpose, making it possible to realize a high speed oversampling A/D converter, whose sampling speed is about twice as high as a conventional such converter.

What is claimed is:

1. An oversampling A/D converter for sampling an input analog signal at a higher frequency than the frequency band thereof and converting it into a digital signal, comprising:
   first and second sample and hold means for alternately sampling and holding said input analog signal during a predetermined first period and generating first and second sampled signals;
   first and second D/A converting means for converting first and second digital local signals into corresponding first and second analog local signals, respectively;
   first and second subtracting means for determining the respective differences between said first and second sampled signals on the one hand and said first and second analog local signals on the other, and generating first and second difference signals;
   selecting means for alternately selecting said first and second difference signals each being selected for a second period equal to half of said first predetermined period;
   integrating means for integrating the output signal of the selecting means and generating an integrated signal;
   quantizing means for quantizing said integrated signal and generating a quantized signal;
   control logic circuit means for generating a digital control signal based on said quantized signal; and
   distributing means for distributing said digital control signal alternately to said D/A converters, for a duration equal to said second period, as said first and second digital local signals.

2. An oversampling A/D converter, as claimed in claim 1, wherein said each of said first and second D/A converting means comprises electric charge redistributing D/A converters.

3. An oversampling A/D converter as claimed in claim 1, wherein said integrating means comprises an operational amplifier and an integrating capacitor.

4. An oversampling A/D converter as claimed in claim 1, wherein said control logic circuit means comprises:
   delay means for delaying an input signal by a duration equal to said second period and supplying a delayed signal;
   inverter means for inverting said delayed signal and supplying an inverted signal;
   means for supplying a control signal based on said inverter signal; and
   up-down counter means, counting up or down according to said control signal, for supplying said digital signal to said distributing means.

5. An oversampling A/D converter comprising:
   an input terminal into which an analog signal is entered;
   a first switching circuit having first and second switches, both connected to said input terminal and operating alternately so that one is open when the other is closed during a predetermined period;
   first and second hold means, connected respectively to said first and second switches, for holding said switched input signal and supplying first and second sampled signals;
   first and second D/A converters responsive to a control signal for D/A converting inputted digital local signals and supplying corresponding first and second analog local signals;
   first and second subtracting means for determining the respective differences between said first and second sampled signals on the one hand and said first and second analog local signals on the other, and generating first and second difference signals;
   a second switching circuit, connected to said first and second subtracting means and having third and fourth switches performing the same operations in synchronism with said first and second switches, for alternately supplying said first and second difference signals in said predetermined period;
   integrating means for integrating the output signal of said second switching circuit and generating an integrated signal;
   quantizing means for quantizing said integrated signal and generating a quantized signal;
   a control logic circuit for generating said digital local signals and said control signal based on said quantized signal; and
   switching means for supplying said digital local signals and said control signal, alternately to said first and second D/A converters in said predetermined period.

6. The A/D converter of claim 5, wherein said control logic circuit comprises means for delaying said quantized signal for a part of said predetermined period, a circuit for generating a polarity signal and a count signals in response said delayed quantized signal, means responsive to said count signal for generating an output count that follows a change in the input analog signal and means responsive to said output count and said count signal for generating said local signals.

7. The A/D converter of claim 6, wherein said switching circuits comprise an inverter, a first and a second plurality of gates, said first and second plurality of gates receiving said local signal and a source of gate signals said gate signals being connected directly to said first plurality of gates and being connected to said second plurality of gates via said invertor.

8. The A/D converter of claim 7 wherein said gate signals appear at a frequency determined by one half said predetermined period.

* * * * *

UNITED STATES PATENT AND TRADEMARK OFFICE
CERTIFICATE OF CORRECTION

PATENT NO. : 4,888,587

DATED : December 19, 1989

INVENTOR(S) : Yoshiaki Kuraishi

It is certified that error appears in the above-identified patent and that said Letters Patent is hereby corrected as shown below:

Title page:

At [54], delete "CAPICITOR" and insert --CAPACITOR-- Col. 1, line 3, delete "CAPICITOR" and insert --CAPACITOR--

Column 8, line 4, delete "invertor" and insert --inverter--

Signed and Sealed this

Eighth Day of January, 1991

Attest:

HARRY F. MANBECK, JR.

*Attesting Officer*     *Commissioner of Patents and Trademarks*